United States Patent [19]

Hsue et al.

[11] Patent Number: 5,115,296
[45] Date of Patent: May 19, 1992

[54] PREFERENTIAL OXIDIZATION SELF-ALIGNED CONTACT TECHNOLOGY

[75] Inventors: Chen-Chiu Hsue; Cheng-Han Huang, both of Hsin-chu, Taiwan

[73] Assignee: United Microelectronics Corporation, Hsinchu, Taiwan

[21] Appl. No.: 640,835

[22] Filed: Jan. 14, 1991

[51] Int. Cl.⁵ .................. H01L 27/02; H01L 21/265
[52] U.S. Cl. .................. 357/42; 357/23.4; 357/23.9; 357/52; 357/55; 437/15; 437/34; 437/27; 437/41; 437/57; 437/192; 437/235
[58] Field of Search .............. 357/42, 23, 4; 437/15, 437/34, 23.9, 52, 55, 41, 27, 57, 235, 192

[56] References Cited

U.S. PATENT DOCUMENTS

| | | | |
|---|---|---|---|
| 4,804,636 | 2/1989 | Groover et al. | 357/42 |
| 4,822,749 | 4/1989 | Flanner et al. | 357/59 |
| 4,949,136 | 8/1990 | Jain | 357/42 |

Primary Examiner—Edward J. Wojciechowicz
Attorney, Agent, or Firm—George O. Saile

[57] ABSTRACT

A method for manufacturing a self-aligned contact MOS field effect transistor integrated circuit has a substrate doped with a first conductivity. The substrate has field oxide regions separating the planned active transistor regions, and gate dielectric/gate electrode structures over the designated channel regions for the integrated circuit device. Opposite type conductivity ions are implanted into the doped silicon substrate to form the lightly doped portion of the source/drain regions for the transistor. Dielectric spacers are formed on the sidewalls of the dielectric/gate electrode structures. A block out mask is formed over the source/drain regions designated to have self-aligned contacts made thereto. Opposite type conductivity ions are implanted into the substrate to form heavily doped portions to complete the formation of the source/drain regions in those non-designated self-aligned contact regions. The block out mask is removed. The structure is subjected to an oxidizing atmosphere to preferentially oxidize polysilicon gate regions and heavily doped source/drain regions (thicker silicon dioxide) is compared to the lightly doped source/drain regions (thinner silicon dioxide). Opposite type conductivity ions are implanted into the doped subtrate to form heavily doped portion and to complete the formation of the source/drain regions in those designated self-aligned contact regions. Chemical dip etching is used to remove thin oxide over the designated self-aligned contact source/drain regions while leaving the thicker oxide layer remaining over the non-designated source/drain regions. The appropriate metallurgy is provided to the designated self-aligned regions to electrically connect MOS field effect transistors into a desired integrated circuit.

27 Claims, 3 Drawing Sheets

PREFERENTIAL OXIDIZATION SELF-ALIGNED CONTACT TECHNOLOGY

BACKGROUND OF THE INVENTION

1. Field of the Invention

The invention is directed to a method and resulting integrated circuit for the manufacture of field effect transistors that is useful in the micron and submicron technology and more particularly to the use of a preferential oxidation technique to allow the formation of self-aligned contacts to designated source/drain regions.

2. Description of the Prior Art

Self-aligned contact processes are very desirable, because they reduce mask steps and more importantly prevent the misalignment due to lithography. This misalignment can cause product defects and yield loss. The normal way to overcome the misalignment problem is to give a greater mask tolerance. However, as design rules and feature sizes are reduced to submicron dimensions, this greater mask tolerance solution becomes a disadvantage.

It is generally known in the art that certain types of silicon doping can cause different thermally grown silicon oxide thickness. References that show this are Bruchez U.S. Pat. No. 3,886,004; Esch et al U.S. Pat. No. 3,899,372; Owen U.S. Pat. No. 4,026,740; Iwai U.S. Pat. No. 4,327,476; Havemann U.S. Pat. No. 4,635,344; Mass et al U.S. Pat. No. 4,659,428; and Verma U.S. Pat. No. 4,717,687. None of these references teach or suggest the present self-aligned contact technology of this invention.

The use of titanium nitride, titanium tungsten or the like as a metallurgy for integrated circuits is known. Also, misalignment problems are known and many solutions have been proposed. Examples of titanium nitride and the like include Jopke, Jr. et al U.S. Pat. No. 4,486,946; Holloway et al U.S. Pat. No. 4,657,628; Orban U.S. Pat. No. 4,745,089; Groover, III et al U.S. Pat. No. 4,804,636; Pintchovski et al U.S. Pat. No. 4,822,753; and Kim et al U.S. Pat. No. 4,845,050. Examples of misalignment solutions are Reynolds et al U.S. Pat. No. 4,381,215; Courreges U.S. Pat. No. 4,392,150; and Aboelfotoh et al U.S. Pat. No. 4,888,297. However, the particular use of this metallurgy and alignment solutions are different from and do not suggest that described in the present invention.

The use of titanium silicide as a contact metallurgy is also known and can be seen in, for example Scovell et al U.S. Pat. No. 4,468,308; Anderson U.S. Pat. No. 4,751,198; Anderson U.S. Pat. No. 4,589,196; Pintchovski U.S. Pat. No. 4,619,038; Scovell et al U.S. Pat. No. 4,772,571; Deneuville et al U.S. Pat. No. 4,777,150; Stevens et al U.S. Pat. No. 4,784,973; and Flanner et al U.S. Pat. No. 4,822,749. The particular process and resulting integrated circuit is not described or suggested by any of these references.

It is therefore a principal object of this invention to describe a process that uses preferential oxidation in the manufacture of MOS field effect transistor integrated circuits to form self-aligned contacts to certain designated source/drain.

SUMMARY OF THE INVENTION

In accordance with the present invention, a method for manufacturing a self-aligned contact MOS field effect transistor integrated circuit is described. A silicon substrate is doped with a dopant of a first conductivity. The substrate has field oxide regions separating the planned active transistor regions, and gate dielectric/gate electrode structure over the designated channel regions for the integrated circuit device. Opposite type conductivity ions are implemented into the doped silicon substrate to form the lightly doped portion of the source/drain regions for the transistor. Sidewall dielectric spacers are formed on the sidewalls of said gate dielectric/gate electrode structures. A block out mask is formed over the source/drain regions designated to have self-aligned contacts made thereto. Opposite type conductivity ions are implanted into the doped substrate to form heavily doped portion and to complete the formation of the source/drain regions in those nondesignated self-aligned contact regions. The said block out mask is removed. The structure is subjected to an oxidizing atmosphere to preferentially oxidize polysilicon gate regions and heavily doped source/drain regions (thicker silicon dioxide) as compared to the lightly doped source/drain regions (thinner silicon dioxide). Opposite type conductivity ions are implanted into the doped substrate to form heavily doped portion and to complete the formation of the source/drain regions in those designated self-aligned contact regions. Chemical dip etching is used to remove thin oxide over the designated self-aligned contact source/drain regions while leaving the thicker oxide layer remaining over the nondesignated source/drain regions. The appropriate metallurgy is provided to the designated self-aligned regions to electrically connect MOS field effect transistors into a desired integrated circuit.

A double diffused device can be formed in a variation to the above method. In this method, the lightly doped ion implantation is not made prior to the formation of the spacer structures. At the time of the opposite conductivity heavily doped ion implantation above where an N channel transistor is being formed, both lightly doped ions—phosphorous—and heavily doped ions—arsenic—are implanted. The subsequent annealing step will result in the desired lightly doped drain structure, since the phosphorous moves faster than the arsenic ions.

Further, a complementary MOS field effect transistor integrated circuit may be fabricated with self-aligned contacts made to designated source/drain regions. A silicon substrate doped with a dopant of a first conductivity is provided. The substrate has P wells formed therein, field oxide regions separating the planned active transistor regions, and gate dielectric/gate electrode structures over the designated channel regions for the N channel and P channel device. N+ source/drain regions for the N channel transistor are provided. Nonuniform silicon oxide is provided on the surfaces wherein there is silicon oxide on the N+ doped surfaces and the polysilicon surfaces. Self-aligned contacts of an appropriate metallurgy are made to designated source/drain regions. P+ source/drain regions for the P channel transistor are provided. The appropriate passivation and metallurgy are provided to electrically connect the complementary MOS field effect transistor into a desired integrated circuit.

BRIEF DESCRIPTION OF THE DRAWINGS

The drawings show the following.

FIG. 5 is a cross-sectional view taken along 5:5 of FIG. 6.

DESCRIPTION OF THE PREFERRED EMBODIMENTS

Figure 1:
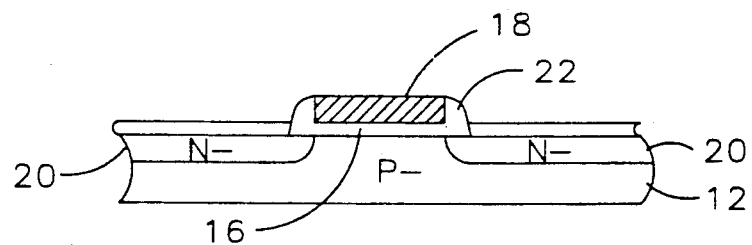
FIGS. 1 through 5 schematically show in cross section one embodiment of the process for fabricating a self-aligned MOS field effect transistor integrated circuit of the present invention.

Referring now to FIG. 1, the first series of steps involve the formation of the dielectric isolation regions for isolating semiconductor surface regions from other such regions. These regions which are conventional are not shown in the Figs. The semiconductor substrate 10 is preferably composed of silicon having a (100) crystallographic orientation. The substrate 10 in this example is doped depending upon the type of device or devices planned to be formed in and on the substrate. The substrate could alternatively have an epitaxial grown layer of doped monocrystalline silicon thereon. The dielectric isolation regions (not shown) may be formed by the various conventional methods understood by those skilled in the field. One method is described by E. Kooi in U.S. Pat. No. 3,970,486 wherein the certain selected surface portions of a silicon semiconductor substrate is masked against oxidation, and then the exposed unmasked surface is oxidized to grow a thermal oxide which in effect sinks the silicon surface at the unmasked areas. The masked silicon remains as a mesa surrounded by the sunken oxide. Then semiconductor devices can be provided by various known techniques in the silicon mesas.

The P and/or N wells are formed in the surface of the substrate for the planned N channel or P channel devices. In this embodiment, there is shown only the P− well 12 for the N channel device to be formed. This well is formed by conventional ion implantation of boron B11 or BF2 ions at dosage of between about $3 \times 10^{12}$ to $3 \times 10^{13}$ atoms/cm.$^2$ and energy of about 100 Kev. For a twin well ion implantation process the P well implant uses B11 with a dosage of between about $3.0 \times 10^{12}$ to $3 \times 10^{13}$ atoms/cm.$^2$ with an energy of about 180 Kev and the N well implant uses P31 with a dosage of between about $1.0 \times 10^{12}$ to $1.0 \times 10^{13}$ atoms/cm.$^2$ with an energy of about 150 Kev.

The gate dielectric silicon oxide is thermally grown in a suitable oxidizing atmosphere to a thickness of between about 18.0 to 22.0 nanometers on the exposed silicon surfaces for a twin well 1.2 micrometer process. A layer of polysilicon is then deposited by conventional silane deposition at about 575° to 650° C. The layer has a thickness of between about 360 to 440 nanometers for the twin well 1.2 micrometer process. The layer is now doped with phosphorus by ion implantation to a sheet resistance of between about 30 to 40 ohms/square for the 1.2 micrometer process. The layers are patterned using conventional lithography and etching techniques to form the gate oxide 16 and gate electrode 18 for both the N channel and P channel devices where a complementary device is being formed or only for the N channel device as shown in FIG. 1.

The lightly doped drain (LDD) N channel source/drain regions are now to be formed. The N− ions are implanted into the desired locations of the source/drain regions 20 of the N channel transistor using the gate structure 16, 18 as the mask. Sidewall spacer structures 22 are formed by conventional techniques of either a blanket chemical vapor deposition of a dielectric, such as silicon dioxide or a thermal growth of silicon dioxide, followed by an anisotropic etching step which removes the horizontal components of the layer and leaves the vertical components of the layer, that is the sidewall spacers 22 as shown in FIG. 1. A thin silicon dioxide layer 21 is thermally grown on the bare surfaces of the structure to complete FIG. 1.

Figure 2:
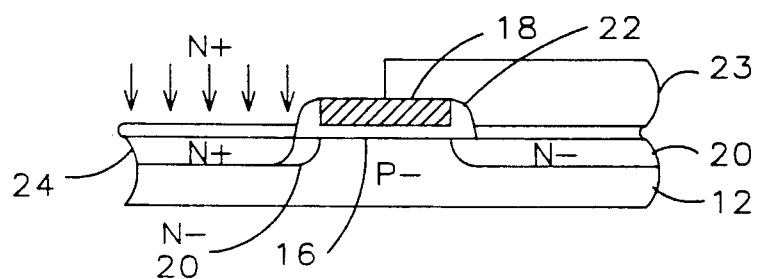

A block out mask 23 of resist material is formed over the source/drain regions designated to have self-aligned the source/drain regions designated to have self-aligned contacts made thereto. Other source/drain regions are left open as shown in FIG. 2. This mask 23 is made by conventional lithography and etching techniques as are none in the art. The N+ ion implantation is now made using typically arsenic ions in the conventional manner to form N+ source/drain regions 24 to complete the FIG. 2. The resist mask 23 is conventionally removed as by oxygen ashing or etching. The silicon dioxide layer 21 is also conventionally removed by etching.

Figure 3:
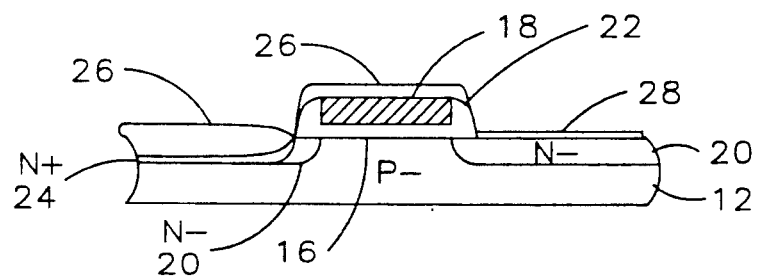

The critical preferentially oxidation is now accomplished which is necessary for the success of the self-aligned contacts of the invention. The next step may be seen with reference to FIG. 3. The FIG. 2 structure, with the block out mask removed is now subjected to a thermal oxidation in wet oxygen at a temperature between about 800 and 1000 C. for a period of 5 to 60 minutes. The length of time depends upon the temperature, the higher the temperature in the range the shorter the time necessary for the desired oxidation of the silicon. For example, oxidation at 800° C. would take 30 minutes and oxidation at 850° C. would take 15 minutes. At 950° to 1000° C. the time necessary for oxidation would be about 5 minutes. It is desired to have the silicon oxide layer 26 to be on the N+ regions to be more than about 150 nanometers and preferably about 180 nanometers, and the silicon dioxide layer 28 on the P/N− regions to be less than about 40 nanometers and preferably about 25 nanometers. The process conditions are made to meet these thickness ranges. The desire is to get a differential silicon dioxide thickness on the source, drain and polysilicon gate surfaces, then we can contact 32 directly after a controlled amount of silicon dioxide chemical etching.

Figure 4:
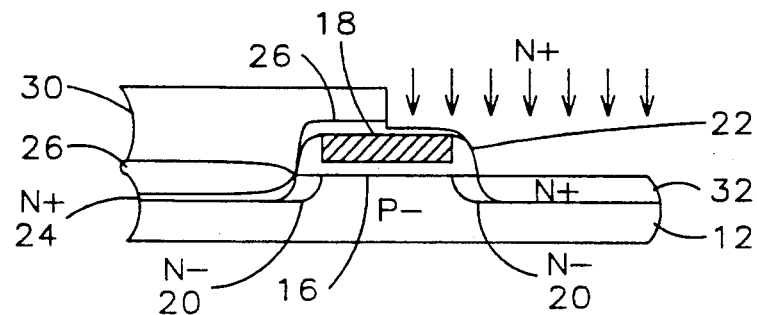

A second resist mask 30 is formed as was the first mask 23, but the openings in this mask 30 is for the source/drain regions that are designated to be self-aligned contact regions. N+ ion implantation of typically arsenic ions into the unblocked substrate through the thin silicon dioxide layer 28 forms the N+ regions 32. A silicon dioxide etch of conventional 6 to 1 buffered silicon oxide etch is used for 0.4 minutes to remove the thin silicon dioxide layer 28 from the designated self-aligned contact source/drain regions. A portion of the silicon dioxide layer 26 which is uncovered by the block out mask 30 is also removed. Some of the unblocked out silicon dioxide layer 26 remains, because of its greater thickness than layer 28 as seen in FIG. 4. The block out mask 30 is now removed by oxygen ashing or etching.

The alternative to this block out mask 30 process and greatly preferred process is to not use a block out mask.

The differential thickness of the silicon dioxide layer 26 over N+ regions 24 and polysilicon layer 18 as compared to the silicon dioxide layer 28 is used as the key feature of this process. The layer 28 is completely removed using a conventional chemical dip etching process without removing all of the thicker layer 26 covering regions 24 and 18. The N+ ion implantation to form N+ region 32 is accomplished as described in the above paragraph. The layer 26 is thick enough to disallow most of the N+ ions from reaching the N+ regions 24.

The desired contact metallurgy is now formed on the surfaces of the FIG. 4 structure. The polycide embodiment is composed of polysilicon layer 34 and refractory metal silicide layer 36. One useful polycide process includes first depositing a layer of about 2500 Angstroms by a conventional chemical vapor deposition process, N+ ion implantation P31 ions of $5 \times 10^{15}$ at about 80 Kev., annealing in nitrogen at 900° C. for about 30 minutes, 10:1 Hydrofluoric acid dip for 30 seconds and standard cleaning, and depositing about 1500 Angstroms of polycide, such as tungsten disilicide by conventional chemical vapor deposition. The result of the self-aligned contact process is shown in FIG. 5.

Figure 5:
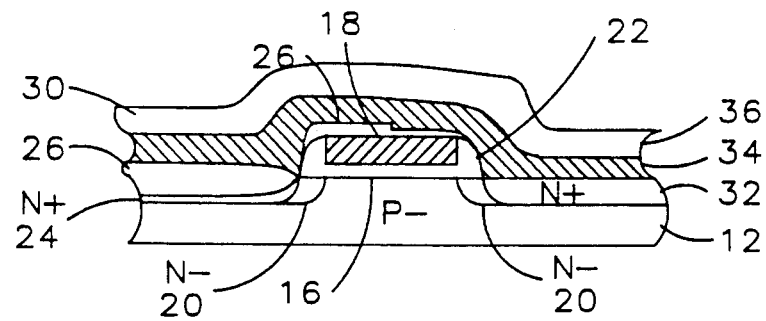
Figure 6:
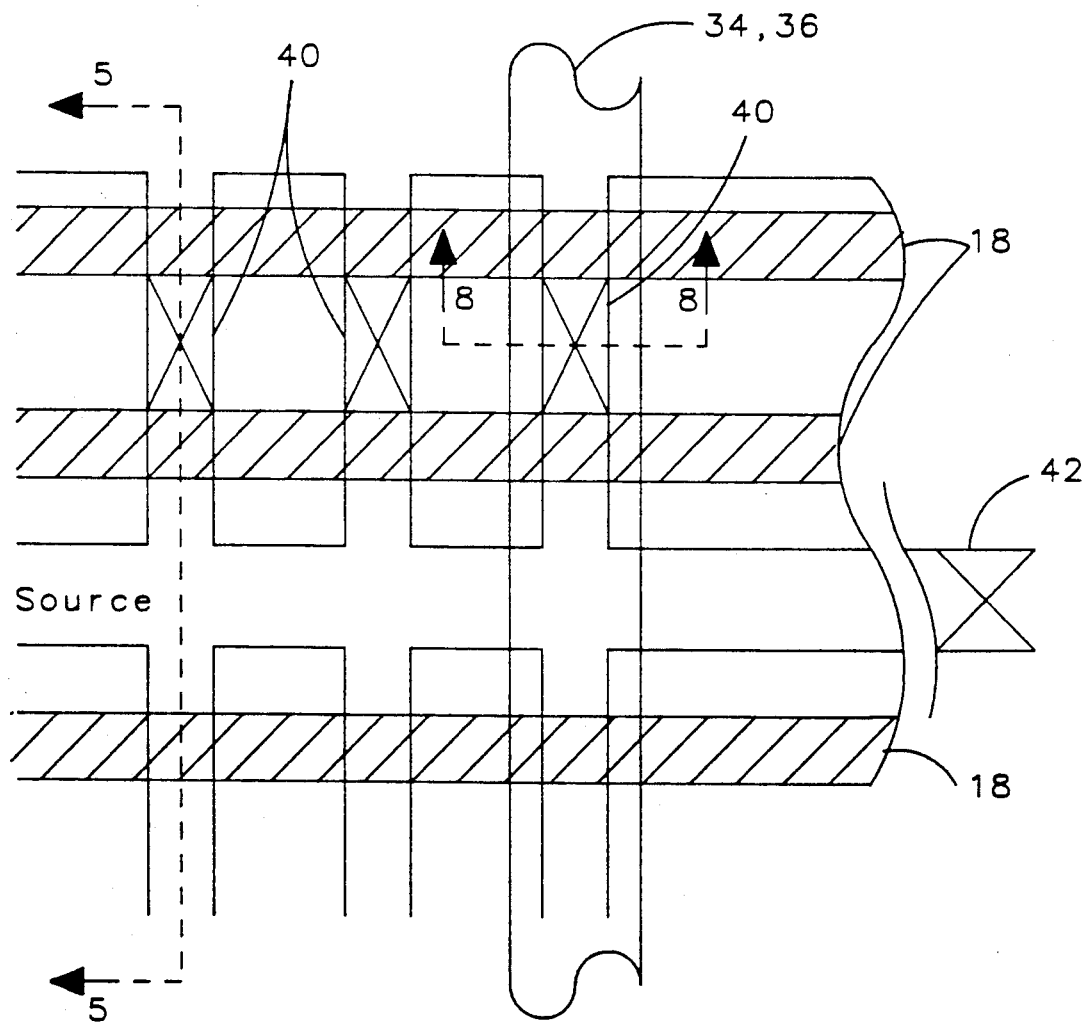
FIG. 6 is a plan view of the embodiment of integrated circuit shown by the FIGS. 1 through 5.

The FIG. 6 shows the plan view of the first embodiment process of FIGS. 1 through 5 wherein a read only memory integrated circuit is manufactured. FIG. 5 cross-section is taken along 5:5 of the FIG. 6. The self-aligned drain contacts 40 are formed to each drain of the read only memory. The common source contact 42 is shown schematically at one end of the layout.

Figure 7:
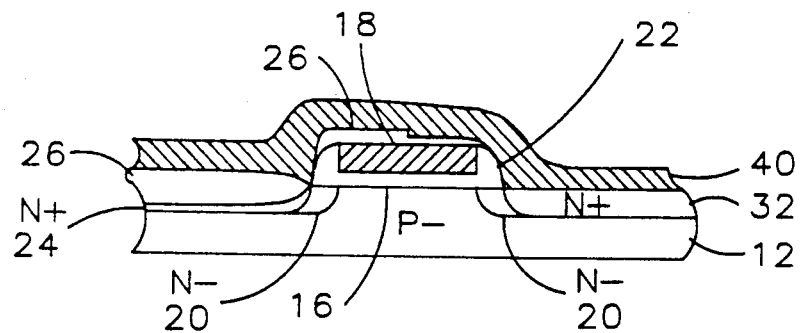
FIG. 7 is a cross sectional view, alternative embodiment to that of FIG. 5.

FIG. 7 shows a cross-section of another metallurgy structure that is useful as a feature of this invention. This is the embodiment that uses either titanium nitride, titanium-tungsten or the like 40. Another alternative is to use titanium silicide. The titanium nitride can be formed by reactive sputtering or by first depositing titanium by sputtering followed by rapid thermal processing (RTP) in a nitrogen or ammonia atmosphere. Titanium-tungsten can be deposited by sputtering.

Figure 8:
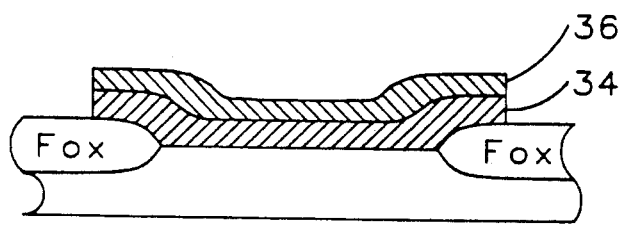
FIG. 8 is a cross-sectional view of the FIG. 6 plan view taken along 8:8 FIG. 6.
Figure 9:
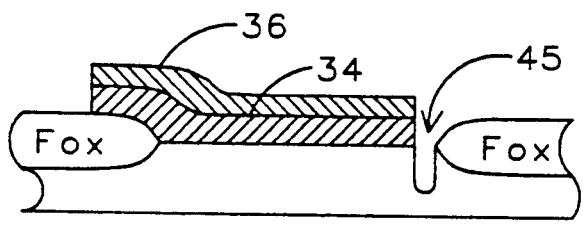
FIG. 9 is a cross-sectional view wherein there is a mask misalignment and a etched defect caused thereby. This problem is solved by the present invention.

FIG. 8 is taken along 8:8 of FIG. 6 to illustrate the advantage of the self-align contact feature over the FIG. 9 misaligned masking alternative wherein an overetched trench 45 is formed because of the misalignment. This shows the advantages of the self-aligned process. However, where titanium nitride or titanium-tungsten are used, the silicon substrate need not be attacked by etchants for these materials. For example, with these materials the wet chemical etchant can be ammonium fluoride and hydrogen peroxide which do not attack silicon.

The final series of steps involve the deposition of passivation and metallurgy layers to electrically contact the elements of the complementary MOS field effect transistor and connect these elements to form the desired circuits on the integrated circuit chip desired. These are done by conventional deposition, lithography, and etching steps that are well understood by those in the art.

A double diffused device (DDD) can be formed in a variation to the FIG. 1 through 5 method. In this DDD method, the lightly doped ion implantation is not made prior to the formation of the spacer structures. In this DDD method, at the time of the opposite conductivity heavily doped ion implantation above where an N channel transistor is being formed, both lightly doped ions-phosphorous- and heavily doped ions-arsenic- are implanted. The subsequent annealing step will result in the desired lightly doped drain structure, since the phosphorous moves faster than the arsenic ions.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a self-aligned contact MOS field effect transistor integrated circuit comprising:

providing a silicon substrate doped with a dopant of a first conductivity;

said substrate having field oxide regions separating the planned active transistor regions, and gate dielectric/gate electrode structures over the designated channel regions for the integrated circuit device;

ion implanting opposite type conductivity ions into the said doped silicon substrate to form the lightly doped portion of the source/drain regions for the transistor;

forming sidewall dielectric spacers on the sidewalls of said gate dielectric/gate electrode structures;

forming a block out mask over the said source/drain regions designated to have self-aligned contacts made thereto while leaving nondesignated self-aligned contacts regions outside of the block out mask;

ion implanting opposite type conductivity ion into the said doped substrate to form heavily doped portion and to complete the formation of the source/drain regions in those said nondesignated self-aligned contact regions;

removing the said block out mask;

subjecting the structure to an oxidizing atmosphere to preferentially oxidize polysilicon gate region and heavily doped source/drain regions as compared to the lightly doped source/drain regions;

ion implanting opposite type conductivity ion into the said doped substrate to form heavily doped portion and to complete the formation of the source/drain regions in those said designated self-aligned contact regions;

etching to remove thin oxide over the said designated self-aligned contact source/drain regions while leaving an oxide layer remaining over the said nondesignated source/drain contact regions; and providing the appropriate metallurgy to said designated self-aligned regions to electrically connect said MOS field effect transistors into a desired said integrated circuit.

2. The method of claim 1 wherein said substrate in N type, has only P wells in said substrate, and N+ type ion implanting is done into said P wells.

3. The method of claim 1 wherein said preferentially oxidize step is done at a temperature between about 800° to 1000° C. for more than about 5 minutes.

4. The method of claim 1 wherein said preferentially oxidize step is at a temperature between about 800° and 900° C. in a wet oxygen atmosphere for more than about 10 minutes.

5. The method of claim 1 wherein said preferentially oxidize step of the exposed surfaces produces silicon oxide of at least 150 nanometers on said N+ regions and less than about 40 nanometers on said P/N− regions.

6. The method of claim 1 wherein the said integrated circuit is a read only memory and is a complementary field effect transistor technology.

7. The method of claim 1 wherein the said metallurgy is composed of polycrystalline silicon having a thickness between about 100 to 300 nanometers.

8. The method of claim 7 wherein the said polycrystalline silicon is part of a polycide structure with a refractory metal silicide.

9. The method of claim 1 wherein the said metallurgy is composed of titanium nitride having a thickness between about 50 to 200 nanometers.

10. The method of claim 1 wherein the said metallurgy is composed of titanium silicide having a thickness between about 20 to 100 nanometers.

11. A method for manufacturing a self-aligned contact MOS field effect transistor integrated circuit comprising:

providing a silicon substrate doped with a dopant of a first conductivity;

said substrate having field oxide regions separating the planned active transistor regions, and gate dielectric/gate electrode structures over the designated channel regions for the integrated circuit device;

forming sidewall dielectric spacers on the sidewalls of said gate dielectric/gate electrode structures;

forming a block out mask over the said source/drain regions designated to have self-aligned contacts made thereto while leaving nondesignated self-aligned contacts regions outside of the block out mask;

ion implanting opposite type conductivity ions of both arsenic and phosphorous into the said doped substrate to form heavily doped portion of arsenic and a lightly doped portion of phosphorous to complete the formation of the source/drain regions in those said nondesignated self-aligned contact regions;

removing the said block out mask;

subjecting the structure to an oxidizing atmosphere to preferentially oxidize polysilicon gate region and heavily doped source/drain regions as compared to the lightly doped source/drain regions;

forming a block out mask pattern to leave uncovered the said self-aligned contact designated source/drain regions;

ion implanting opposite type conductivity arsenic and phosphorous ions into the said doped substrate to form arsenic heavily doped portion and phosphorous lightly doped portion to complete the formation of the source/drain regions in those said designated self-aligned contact regions;

removing the said block out mask;

etching to remove thin oxide over the said designated self-aligned contact source/drain regions while leaving an oxide layer remaining over the said nondesignated source/drain contact regions; and providing the appropriate metallurgy to said designated self-aligned regions to electrically connect said MOS field effect transistors into a desired said integrated circuit.

12. The method of claim 11 wherein said substrate is N type, has only P wells in said substrate, and N+ type ion implanting is done into said P wells.

13. The method of claim 11 wherein said preferentially oxidize step is done at a temperature between about 800° to 1000° C. for more than about 5 minutes.

14. The method of claim 11 wherein said preferentially oxidize step is at a temperature between about 800° and 900° C. in a wet oxygen atmosphere for more than about 10 minutes.

15. The method of claim 11 wherein said preferentially oxidize step of the exposed surfaces produces silicon oxide of at least 150 nanometers on said N+ regions and less than about 40 nanometers on said P/N− regions.

16. The method of claim 11 wherein the said integrated circuit is a read only memory and is a complementary field effect transistor technology.

17. The method of claim 11 wherein the said metallurgy is composed of polycrystalline silicon having a thickness between about 100 to 300 nanometers.

18. The method of claim 17 wherein the said polycrystalline silicon is part of a polycide structure with a refractory metal silicide.

19. The method of claim 11 wherein the said metallurgy is composed of titanium nitride having a thickness between about 50 to 200 nanometers.

20. The method of claim 11 wherein the said metallurgy is composed of titanium silicide having a thickness between about 20 to 100 nanometers.

21. A self-aligned contact MOS field effect transistor integrated circuit made by the method comprising:

providing a silicon substrate doped with a dopant of a first conductivity;

said substrate having field oxide regions separating the planned active transistor regions, and gate dielectric/gate electrode structures over the designated channel regions for the integrated circuit device;

ion implanting opposite type conductivity ions into the said doped silicon substrate to form the lightly doped portion of the source/drain regions for the transistor;

forming sidewall dielectric spacers on the sidewalls of said gate dielectric/gate electrode structures;

forming a block out mask over the said source/drain regions designated to have self-aligned contacts made thereto while leaving nondesignated self-aligned contact regions outside of the block out mask;

ion implanting opposite type conductivity ion into the said doped substrate to form heavily doped portion and to complete the formation of the source/drain regions in those said nondesignated self-aligned contact regions;

removing the said block out mask;

subjecting the structure to an oxidizing atmosphere to preferentially oxidize polysilicon gate region and heavily doped source/drain regions as compared to the lightly doped source/drain regions;

ion implanting opposite type conductivity ion into the said doped substrate to form heavily doped portion and to complete the formation of the source/drain regions in those said designated self-aligned contact regions;

etching to remove thin oxide over the said designated self-aligned contact source/drain regions while leaving an oxide layer remaining over the said nondesignated source/drain contact regions; and providing the appropriate metallurgy to said designated self-aligned regions to electrically connect said MOS field effect transistors into a desired said integrated circuit.

22. The integrated circuit of claim 21 wherein said silicon oxide is at least 150 nanometers on said N− regions.

23. The integrated circuit of claim 21 wherein the said integrated circuit is a read only memory.

24. The integrated circuit of claim 21 wherein the said metallurgy is composed of polycrystalline silicon having a thickness between about 100 to 300 nanometers.

25. The integrated circuit of claim 21 wherein the said polycrystalline silicon is part of a polycide structure with a refractory metal silicide.

26. The integrated circuit of claim 21 wherein the said metallurgy is composed of titanium nitride having a thickness between about 50 to 200 nanometers.

27. The integrated circuit of claim 21 wherein the said metallurgy is composed of titanium silicide having a thickness between about 20 to 100 nanometers.

* * * * *